(12) United States Patent
Liu et al.

(10) Patent No.: US 9,454,972 B2
(45) Date of Patent: Sep. 27, 2016

(54) AUDIO AND SPEECH CODING DEVICE, AUDIO AND SPEECH DECODING DEVICE, METHOD FOR CODING AUDIO AND SPEECH, AND METHOD FOR DECODING AUDIO AND SPEECH

(71) Applicant: Panasonic Intellectual Property Corporation of America, Torrance, CA (US)

(72) Inventors: Zongxian Liu, Singapore (SG); Srikanth Nagisetty, Singapore (SG); Masahiro Oshikiri, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 59 days.

(21) Appl. No.: 14/376,501

(22) PCT Filed: Feb. 1, 2013

(86) PCT No.: PCT/JP2013/000550
§ 371 (c)(1),
(2) Date: Aug. 4, 2014

(87) PCT Pub. No.: WO2013/118476
PCT Pub. Date: Aug. 15, 2013

(65) Prior Publication Data
US 2015/0025879 A1    Jan. 22, 2015

(30) Foreign Application Priority Data
Feb. 10, 2012  (JP) .................................. 2012-027702

(51) Int. Cl.
*G10L 19/00* (2013.01)
*G10L 19/038* (2013.01)
(Continued)

(52) U.S. Cl.
CPC ............ *G10L 19/038* (2013.01); *G10L 19/16* (2013.01); *G10L 19/12* (2013.01)

(58) Field of Classification Search
None
See application file for complete search history.

(56) References Cited

U.S. PATENT DOCUMENTS

2005/0285764 A1   12/2005   Bessette et al.
2007/0147518 A1    6/2007   Bessette
(Continued)

FOREIGN PATENT DOCUMENTS

EP    2772912        9/2014
JP    2005-528839    9/2005
(Continued)

OTHER PUBLICATIONS

Vaillancourt et al., "ITU-T EV-VBR: A Robust 8-32 KBITS/S Scalable Coder for Error Prone Telecommunications Channels", Proc. Eusipco., Lausanne, Switzerland, Aug. 2008.
(Continued)

*Primary Examiner* — Satwant Singh
(74) *Attorney, Agent, or Firm* — Greenblum & Bernstein, P.L.C.

(57) ABSTRACT

This invention introduces audio/speech encoding apparatus audio/speech decoding apparatus, audio/speech encoding method and audio/speech decoding method to efficiently encode the quantization parameters of split multi-rate lattice vector quantization. In this invention, the position of the sub-vector whose codebook indication consumes the most bits is firstly located, and then the value of the codebook is estimated based on the total number of bits available and the bits usage information for other sub-vectors. The difference value is calculated between the actual value and estimated value. Finally, instead of transmitting the codebook indication which consumes the most bits, the position of the sub-vector whose codebook indication consumes the most bits and the difference value between the actual value and the estimated value are transmitted. By applying of the invented method, bits can be saved by the codebook indications.

4 Claims, 14 Drawing Sheets

(51) Int. Cl.
*G10L 19/16* (2013.01)
*G10L 19/12* (2013.01)

(56) References Cited

U.S. PATENT DOCUMENTS

| | | | |
|---|---|---|---|
| 2007/0225971 | A1 | 9/2007 | Bessette |
| 2007/0282603 | A1 | 12/2007 | Bessette |
| 2009/0240491 | A1 | 9/2009 | Reznik |
| 2011/0282677 | A1* | 11/2011 | Wu .................... G10L 19/0212 704/500 |
| 2012/0226505 | A1* | 9/2012 | Lin ...................... G10L 19/002 704/500 |
| 2013/0103394 | A1 | 4/2013 | Liu et al. |
| 2013/0173272 | A1* | 7/2013 | Wu .................... G10L 19/0212 704/500 |
| 2014/0249806 | A1* | 9/2014 | Liu ..................... G10L 19/038 704/206 |

FOREIGN PATENT DOCUMENTS

| | | |
|---|---|---|
| JP | 2007-525707 | 9/2007 |
| WO | 2011/063694 | 6/2011 |
| WO | 2012/004998 | 1/2012 |

OTHER PUBLICATIONS

Lefebvre et al., "High Quality Coding of Wideband Audio Signals Using Transform Coded Excitation (TCX)", IEEE International Conference on Acoustics, Speech, and Signal Processing, vol. 1, Apr. 1994, pp. I/193-I/196.

Ragot et al., "Low-Complexity Multi-Rate Lattice Vector Quantization With Application to Wideband TCX Speech Coding At 32 KBIT/S", Proc. IEEE International Conference on Acoustics, Speech, and Signal Processing (ICASSP), Montreal, QC, vol. 1, May 2004, pp. 501-504.

"3rd Generation Partnership Project: Technical Specification Group Services and System Aspects; Audio codec processing functions; Extended Adaptive Multi-Rate—Wideband (AMR-WB+) codec; Transcoding functions (Release 11)", 3GPP TS 26.290, V11.0.0, Sep. 2010, pp. 1-85.

Xie et al., "Embedded Algebraic Vector Quantizers (EAVQ) With Application to Wideband Speech Coding", IEEE International Conference on Acoustics, Speech, and Signal Processing (ICASSIP), Atlanta, GA, U.S.A, vol. 1, May 1996, pp. 240-243.

"Series G: Transmission Systems and Media, Digital Systems and Networks, Digital terminal equipments—Coding of analogue signals by methods other than PCM, G.279-based embedded variable bit-rate coder: An 8-32 kbit/s scalable wideband coder bitstream interoperable with G.729", ITU-T Recommendation G.729.1, May 2006, pp. 1-100.

Karlheinz Brandenberg, "MP3 and AAC Explained", AES 17th International Conference on High Quality Audio Coding, Florence, Italy, Sep. 1999, pp. 1-12.

International Search Report, mailed Apr. 16, 2013 in corresponding International Application No. PCT/JP2013/000550.

Extended European Search Report, mailed Apr. 10, 2015, from the European Patent Office in the corresponding European Patent Application No. 13747107.

"3$^{rd}$ Generation Partnership Project; Technical Specification Group Services and System Aspects; Audio codec processing functions; Extended Adaptive Multi-Rate—Wideband (AMR-WB+) codec; Transcoding functions (Release 10)", 3GPP TS 26.290, V10.0.0, Mar. 2011.

Stéphane Ragot et al., Low-Complexity Multi-Rate Lattice Vector Quantization With Application to Wideband TCX Speech Coding At 32 Kbit/s, IEEE, ICASSP 2004, pp. I-501-I-504.

* cited by examiner

| Codebook number | Codebook | Codebook Indication | Codebook indication bits consumption | Code vector index bits consumption | Total bits consumption |
|---|---|---|---|---|---|
| 0 | Q0 | 0 | 1 | 0 | 1 |
| 2 | Q2 | 10 | 2 | 8 | 10 |
| 3 | Q3 | 110 | 3 | 12 | 15 |
| 4 | Q4 | 1110 | 4 | 16 | 20 |
| 5 | Q5 | 11110 | 5 | 20 | 25 |
| ⋮ | ⋮ | ⋮ | ⋮ | ⋮ | ⋮ |

| Sub vector | v1 | v2 | v3 | v4 | v5 | v6 | v7 | v8 |
|---|---|---|---|---|---|---|---|---|
| Codebook | Q2 | Q2 | Q11 | Q3 | Q2 | Q2 | Q2 | Q2 |
| Bits consumption for codebook indication | 2 | 2 | 11 | 3 | 2 | 2 | 2 | 2 |
| Total Bits consumption for each sub vector | 10 | 10 | 55 | 15 | 10 | 10 | 10 | 10 |
| Total bits consumption for all the sub vectors | 130 (2 bits left unused) | | | | | | | |

FIG.10

| Sub-vector index | v1 | v2 | v3 | v4 | v5 | v6 | v7 | v8 |
|---|---|---|---|---|---|---|---|---|
| Codebook | Q2 | Q2 | Q11 | Q3 | Q2 | Q2 | Q2 | Q2 |
| Codebook indication | 10 | 10 | 11111111110 | 110 | 10 | 10 | 10 | 10 |

FIG.11

| Position of the sub-vector | v1 | v2 | v3 | v4 | v5 | v6 | v7 | v8 |
|---|---|---|---|---|---|---|---|---|
| Code for position | 000 | 001 | 010 | 011 | 100 | 101 | 110 | 111 |

FIG.12

| Difference | 0 | -1 | -2 | -3 | ......... |
|---|---|---|---|---|---|
| Code for difference | 0 | 10 | 110 | 1110 | ......... |

FIG.13

| Sub-vector index | v1 | v2 | v3 | V4 | v5 | v6 | v7 | v8 |
|---|---|---|---|---|---|---|---|---|
| Codebook | Q2 | Q7 | Q3 | Q0 | Q0 | Q2 | Q0 | Q0 |
| Codebook indication | 10 | 1111110 | 110 | 0 | 0 | 10 | 0 | 0 |
| Bits consumption | 10 | 35 | 15 | 1 | 1 | 10 | 1 | 1 |
| Bits left | 62 | 27 | 12 | 11 | 10 | 0 | No bits to encode | |

FIG.17

| Sub-vector index | v1 | v3 | V4 | v5 | v6 | v7 | v8 |
|---|---|---|---|---|---|---|---|
| Codebook | Q2 | Q3 | Q0 | Q0 | Q2 | Q0 | Q0 |
| Codebook indication | 10 | 110 | 0 | 0 | 10 | 0 | 0 |
| Bits consumption | 10 | 15 | 1 | 1 | 10 | 1 | 1 |
| Bits left | 62 | 47 | 46 | 45 | 35 | 34 | 33 |

AUDIO AND SPEECH CODING DEVICE, AUDIO AND SPEECH DECODING DEVICE, METHOD FOR CODING AUDIO AND SPEECH, AND METHOD FOR DECODING AUDIO AND SPEECH

TECHNICAL FIELD

The present invention relates to an audio/speech encoding apparatus, audio/speech decoding apparatus and audio/speech encoding and decoding methods using vector quantization.

BACKGROUND ART

In audio and speech coding, there are mainly two types of coding approaches: Transform Coding and Linear Prediction Coding.

Transform coding involves the transformation of the signal from time domain to spectral domain, such as using Discrete Fourier Transform (DFT: Discrete Fourier Transform) or Modified Discrete Cosine Transform (MDCT: Modified Discrete Cosine Transform). The spectral coefficients are quantized and encoded. In the process of quantization or encoding, psychoacoustic model is normally applied to determine the perceptual importance of the spectral coefficients, and then the spectral coefficients are quantized or encoded according to their perceptual importance. Some popular transform codecs are MPEG MP3, MPEG AAC (see NPL 1) and Dolby AC3. Transform coding is effective for music or general audio signals. A simple framework of transform codec is shown in FIG. 1.

In the encoder illustrated in FIG. 1, the time domain signal S(n) is transformed into frequency domain signal S(f) using time to frequency transformation method (101), such as Discrete Fourier Transform (DFT) or Modified Discrete Cosine Transform (MDCT).

Psychoacoustic model analysis is done on the frequency domain signal S(f) to derive the masking curve (103). Quantization is performed on the frequency domain signal S(t) according to the masking curve derived from the psychoacoustic model analysis to ensure that the quantization noise is inaudible (102).

The quantization parameters are multiplexed (104) and transmitted to the decoder side.

In the decoder illustrated in FIG. 1, at the start, all the bitstream information is de-multiplexed (105). The quantization parameters are dequantized to reconstruct the decoded frequency domains signal $\tilde{S}(f)$ (106).

The decoded frequency domain signal $\tilde{S}(f)$ is transformed back to time domain, to reconstruct the decoded time domain signal $\tilde{S}(n)$ using frequency to time transformation method (107), such as Inverse Discrete Fourier Transform (IDFT: Inverse Discrete Fourier Transform) or Inverse Modified Discrete Cosine Transform (IMDCT: Inverse Modified Discrete Cosine Transform).

On the other hand, linear prediction coding exploits the predictable nature of speech signals in time domain, obtains the residual/excitation signal by applying linear prediction on the input speech signal. For speech signal, especially for voiced regions, which have resonant effect and high degree of similarity over time shifts that are multiples of their pitch periods, this modelling produces very efficient presentation of the sound. After the linear prediction, the residual/excitation signal is mainly encoded by two different methods, TCX and CELP.

In TCX (see NPL 2), the residual/excitation signal is transformed and encoded efficiently in the frequency domain. Some popular TCX codecs are 3GPP AMR-WB+, MPEG USAC. A simple framework of TCX codec is shown in FIG. 2.

In the encoder illustrated in FIG. 2, LPC analysis is done on the input signal to exploit the predictable nature of signals in time domain (201). The LPC coefficients from the LPC analysis are quantized (202), the quantization indices are multiplexed (207) and transmitted to decoder side. With the dequantized LPC coefficients dequantized by dequantization section (203), the residual (excitation) signal $S_r(n)$ is obtained by applying LPC inverse filtering on the input signal S(n) (204).

The residual signal $S_r(n)$ is transformed to frequency domain signal $S_r(f)$ using time to frequency transformation method (205), such as Discrete Fourier Transform (DFT) or Modified Discrete Cosine Transform (MDCT).

Quantization is performed on $S_r(f)$ (206) and quantization parameters are multiplexed (207) and transmitted to the decoder side.

In the decoder illustrated in FIG. 2, at the start, all the bitstream information is de-multiplexed at (208).

The quantization parameters are dequantized to reconstruct the decoded frequency domain residual signal $\tilde{S}_r(f)$ (210).

The decoded frequency domain residual signal $\tilde{S}_r(f)$ is transformed back to time domain, to reconstruct the decoded time domain residual signal $\tilde{S}_r(n)$ using frequency to time transformation method (211), such as Inverse Discrete Fourier Transform (IDFT) or Inverse Modified Discrete Cosine Transform (IMDCT).

With the dequantized LPC parameters dequantized by the dequantization section (209), the decoded time domain residual signal $\tilde{S}_r(n)$ is processed by LPC synthesis filter (212) to obtain the decoded time domain signal $\tilde{S}(n)$.

In the CELP coding, the residual/excitation signal is quantized using some predetermined codebook. And in order to further enhance the sound quality, it is popular to transform the difference signal between the original signal and the LPC synthesized signal to frequency domain and further encode. Some popular CELP codecs are ITU-T G.729.1 (see NPL 3), ITU-T G.718 (see NPL 4). A simple framework of hierarchical coding (layered coding, embedded coding) of CELP and transform coding is shown in FIG. 3.

In the encoder illustrated in FIG. 3, CELP encoding is done on the input signal to exploit the predictable nature of signals in time domain (301). With the CELP parameters, the synthesized signal is reconstructed by the CELP local decoder (302). The prediction error signal $S_e(n)$ (the difference signal between the input signal and the synthesized signal) is obtained by subtracting the synthesized signal from the input signal.

The prediction error signal $S_e(n)$ is transformed into frequency domain signal $S_e(f)$ using time to frequency transformation method (303), such as Discrete Fourier Transform (DPT) or Modified Discrete Cosine Transform (MDCT).

Quantization is performed on $S_e(f)$ (304) and quantization parameters are multiplexed (305) and transmitted to the decoder side.

In the decoder illustrated in FIG. 3, at the start, all the bitstream information is de-multiplexed (306).

The quantization parameters are dequantized to reconstruct the decoded frequency domain residual signal $\tilde{S}_e(f)$ (308).

The decoded frequency domain residual signal $\tilde{S}_e(f)$ is transformed back to time domain, to reconstruct the decoded time domain residual signal $\tilde{S}_e(n)$ using frequency to time transformation method (309), such as Inverse Discrete Fourier Transform (IDFT) or Inverse Modified Discrete Cosine Transform (IMDCT).

With the CELP parameters, the CELP decoder reconstructs the synthesized signal $S_{syn}(n)$ (307), the decoded time domain signal $\tilde{S}(n)$ is reconstructed by adding the CELP synthesized signal $S_{syn}(n)$ and the decoded prediction error signal $\tilde{S}_e(n)$.

The transform coding and the transform coding part in linear prediction coding are normally performed by utilizing some quantization methods.

One of the vector quantization methods is named as split multi-rate lattice VQ or algebraic VQ (AVQ) (see NPL 5). In AMR-WB+ (see NPL 6), split multi-rate lattice VQ is used to quantize the LPC residual in TCX domain (as shown in FIG. 4). In the newly standardized speech codec ITU-T G.718, split multi-rate lattice VQ is also used to quantize the LPC residue in MDCT domain as residue coding layer 3.

Split multi-rate lattice VQ is a vector quantization method based on lattice quantizers. Specifically, for the split multi-rate lattice VQ used in AMR-WB+ (see NPL 6), the spectrum is quantized in blocks of 8 spectral coefficients using vector codebooks composed of subsets of the Gosset lattice, referred to as the RE8 lattice (see NPL 5).

All points of a given lattice can be generated from the so-called squared generator matrix G of the lattice, as $c = s \cdot G$, where s is a line vector with integer values and c is the generated lattice point.

To form a vector codebook at a given rate, only lattice points inside a sphere (in 8 dimensions) of a given radius are taken. Multi-rate codebooks can thus be formed by taking subsets of lattice points inside spheres of different radii.

A simple framework which utilizes the split multi-rate vector quantization in TCX codec is illustrated in FIG. 4.

In the encoder illustrated in FIG. 4, LPC analysis is done on the input signal to exploit the predictable nature of signals in time domain (401). The LPC coefficients from the LPC analysis are quantized (402), the quantization indices are multiplexed (407) and transmitted to decoder side. With the dequantized LPC coefficients dequantized by dequantization section (403), the residual (excitation) signal $S_r(n)$ is obtained by applying LPC inverse filtering on the input signal S(n) (404).

The residual signal $S_r(n)$ is transformed to frequency domain signal $S_r(f)$ using time to frequency transformation method (405), such as Discrete Fourier Transform (DFT) or Modified Discrete Cosine Transform (MDCT).

Split multi-rate lattice vector quantization method is applied on $S_r(f)$ (406) and quantization parameters are multiplexed (407) and transmitted to the decoder side.

In the decoder illustrated in FIG. 4, at the start, all the bitstream information is de-multiplexed (408).

The quantization parameters are dequantized by split multi-rate lattice vector dequantization method to reconstruct the decoded frequency domain residual signal $\tilde{S}_r(f)$ (410).

The decoded frequency domain residual signal $\tilde{S}_r(f)$ is transformed back to time domain, to reconstruct the decoded time domain residual signal $\tilde{S}_r(n)$ using frequency to time transformation method (411), such as Inverse Discrete Fourier Transform (IDFT) or Inverse Modified Discrete Cosine Transform (IMDCT).

With the dequantized LPC parameters dequantized by the dequantization section (409), the decoded time domain residual signal $\tilde{S}_r(n)$ is processed by LPC synthesis filter (412) to obtain the decoded time domain signal $\tilde{S}(n)$.

FIG. 5 illustrates the process of split multi-rate lattice VQ. In this process, the input spectrum S(f) is split to a number of 8-dimensional blocks (or vectors) (501), and each block (or vector) is quantized by the multi-rate lattice vector quantization method (502). In the quantization step, a global gain is firstly calculated according to the bits available and the energy level of the whole spectrum. Then for each block (or vector), the ratio between the original spectrum and the global gain is quantized by different codebooks. The quantization parameters of split multi-rate lattice VQ are the quantization index of a global gain, codebook indications for each block (or vector) and code vector indices for each block (or vector).

FIG. 6 summarizes the list of codebooks of split multi-rate lattice VQ adopted in AMR-WB+ (see NPL 6). In the table, the codebook $Q_0$, $Q_2$, $Q_3$ and $Q_4$ are the base codebooks. When a given lattice point is not included in these base codebooks, the Voronoi extension (see NPL 7) is applied, using only the $Q_3$ or $Q_4$ part of the base codebook. As example, in the table, Q5 is Voronoi extension of Q3, Q6 is Voronoi extension of Q4.

Each codebook consists of a number of code vectors. The code vector index in the codebook is represented by a number of bits. The number of bits is derived by equation 1 as shown below:

[1]

$$N_{bits} = \log_2(N_{cv}) \qquad \text{(Equation 1)}$$

Here, $N_{bit}$ means the number of bits consumed by the code vector index and $N_{cv}$ means the number of code vector in the codebook.

In the codebook Q0, there is only one vector, the null vector, means the quantized value of the vector is 0. Therefore no bits are required for the code vector index.

As there are three sets of the quantization parameters for split multi-rate lattice VQ: the index of global gain, the indications of the codebooks and the indices of the code vectors. The bitstream are normally formed in two ways. The first method is illustrated in FIG. 7, and the second method is illustrated in FIG. 8.

In FIG. 7, the input signal S(f) is firstly split to a number of vectors. Then a global gain is derived according to the bits available and the energy level of the spectrum. The global gain is quantized by a scalar quantizer and the S(f)/G is quantized by the multi-rate lattice vector quantizer. When the bitstream is formed, the index of the global gain forms the first portion, all the codebook indications are grouped together to form the second portion and all the indices of the code vectors are grouped together to form the last portion.

In FIG. 8, the input signal S(f) is firstly split to a number of vectors. Then a global gain is derived according to the bits available and the energy level of the spectrum. The global gain is quantized by a scalar quantizer and the S(f)/G is quantized by the multi-rate lattice vector quantizer. When the bitstream is formed, the index of the global gain forms the first portion, the codebook indication followed by the code vector index for each vector is to form the second portion.

CITATION LIST

Patent Literature

NPL1
Karl Heinz Brandenburg, "MP3 and AAC Explained", *AES 17th International Conference*, Florence, Italy, September 1999.

NPL2
Lefebvre, et al., "High quality coding of wideband audio signals using transform coded excitation (TCX)", *IEEE International Conference on Acoustics, Speech, and Signal Processing*, vol. 1, pp. 1/193-1/196, April 1994

NPL3
ITU-T Recommendation G.729.1 (2007) "G.729-based embedded variable bit-rate coder: An 8-32 kbit/s scalable wideband coder bitstream interoperable with G.729"

NPL4
T. Vaillancourt et al. "ITU-T EV-VBR: A Robust 8-32 kbit/s Scalable Coder for Error Prone Telecommunication Channels", in *Proc. Eusipco*, Lausanne, Switzerland, August 2008

NPL5
M. Xie and J.-P. Adoul, "Embedded algebraic vector quantization (EAVQ) with application to wideband audio coding," IEEE International Conference on Acoustics, Speech, and Signal Processing (ICASSP), Atlanta, Ga., U.S.A, 1996, vol. 1, pp. 240-243

NPL6
3GPP TS 26.290 "Extended AMR Wideband Speech Codec (AMR-WB+)"

NPL7
S. Ragot, B. Bessette and R. Lefebvre, "Low-complexity Multi-Rate Lattice Vector Quantization with Application to Wideband TCX Speech Coding at 32 kbit/s," Proc. IEEE International Conference on Acoustics, Speech, and Signal Processing (ICASSP), Montreal, QC, Canada, May, 2004, vol. 1, pp. 501-504

SUMMARY OF INVENTION

Technical Problem

The input spectrum normally doesn't have same energy in every sub-vector, but concentrates energy in some of the sub-vectors. As an example, for the spectrum shown in the FIG. 9, among the 8 sub-vectors, sub-vector v3 has the largest energy, according to the process of split multi-rate lattice vector quantization, v3's codebook has the largest codebook number (the integer number n of Qn is called here a codebook number) comparing to other sub-vectors.

As shown in the codebook indication table in FIG. 6, the larger the codebook number, the more bits the codebook indication consumes. Then in the example, sub-vector v3 consumes the most bits for the codebook indication. It is desirable to reduce the bits consumption for the codebook indications for the codebooks with larger codebook number as they may consume too many bits (e.g. a few times more than the codebook indications for the codebooks with smaller codebook number).

In NPL7, split multi-rate lattice VQ is used for the TCX speech codec, the parameters are: number of sub-vectors, $N_{sv}$=8 and number of bits available, $Bits_{available}$=132 bits. And it was mentioned that, in practice a peak codebook number of 11 was measured.

Let us assume that for the spectrum in FIG. 9, v3 utilizes codebook of Q11, v4 utilizes codebook of Q3 and codebooks for all other sub-vectors are Q2. The bits consumption information can be summarized as in FIG. 10.

As shown in FIG. 10, the codebook indication for v3 consumes 11 bits while the codebook indication for v4 consumes 3 bits and codebook indications for other vectors consume 2 bits. The codebook indication for v3 consumes more than 5 times bits than the codebook indication for v1 (v2, v5, v6, v7, or v8).

In prior arts, the codebook indications and code vector indices are directly converted to binary number and form the bit stream. Therefore the total bits consumption for all the vectors can be calculated in the following manner:

(Equation 2)

$$Bits_{total} = Bits_{gain\_q} + \sum_{i=1}^{N} Bits_{cb\_indication}(i) + \sum_{i=1}^{N} Bits_{cv\_index}(i) \quad [2]$$

Here, $Bits_{total}$ is the total bits consumption, $Bits_{gain\_q}$ is the bits consumption for quantization of the global gain, $Bits_{cb\_indication}$ is the bits consumption for the codebook indication for each vector, $Bits_{cv\_index}$ is the bits consumption for the code vector index for each vector and N is the total number of vectors in the whole spectrum.

It is desirable to reduce the bits consumption for the codebook indication for the codebooks with larger codebook numbers as it consumes too many bits.

Solution to Problem

In this invention, an idea is introduced to efficiently encode the quantization parameters of split multi-rate lattice vector quantization. Firstly the position of the sub-vector whose codebook indication consumes the most bits is located, and then the value of its codebook is estimated based on the total number of bits available and the bits usage information for other sub-vectors. The difference value is calculated between the actual value and estimated value. Then, instead of transmitting the codebook indication which consumes the most bits, the position of the sub-vector which uses the codebook and the difference value between the actual value and the estimated value are transmitted. By applying the invented method, some bits can be saved from the codebook indications.

The detail process at encoder is illustrated as below:
1) Compute the codebook indications for all sub-vectors
2) Identify and encode the position of the sub-vector whose codebook indication consumes the most bits and encode the codebook indications for all sub-vectors except the sub-vector consuming the most bits.
3) Estimate the codebook whose indication consumes the most bits
4) Encode the difference between the actual value and the estimated value The detail process at decoder is illustrated as below:
1) Decode the position of the sub-vector whose codebook indication consumes the most bits
2) Decode the codebook indications for all other sub-vectors
3) Estimate the codebook whose indication consumes the most bits
4) Decode the difference between the actual value and the estimated value
5) Compute the decoded value by adding the estimated value and the difference The spectrum in FIG. 9 is used as example for the detail illustration:
1) Compute the codebook indications for all sub-vectors, referring to the codebook indication table in FIG. 6, the detail results are shown in FIG. 11.
2) Identify and encode the position of the sub-vector whose codebook indication consumes the most bits encode the codebook indications for all sub-vectors except the sub-vector consuming the most bits. As shown in FIG. 11, the sub-vector, v3's codebook indication consumes the most bits. As example, the codebook shown in FIG. 12 is used to encode the position. Referring to FIG. 12, v3's position is encoded as 010.

3) Estimate the codebook whose indication consumes the most bits according to the equation below:

(Equation 3)

$$cb'_{max} = \left(Bits_{available} - \sum_{i=1}^{2} Bits_{cb_{v_i}} - \sum_{i=4}^{8} Bits_{cb_{v_i}}\right) / 5 \quad [3]$$
$$= (132 - 10 - 10 - 15 - 10 - 10 - 10 - 10)/5$$
$$\approx 11$$

Here, $cb'_{max}$ is the estimated value for the codebook which consumes the most bits, $Bits_{available}$ is the total bits available and $Bits_{cbvi}$ is the bits consumption for the codebook indication of vi.

4) Encode the difference between the actual value and the estimated value. The difference value is calculated according to the equation 4, and it is encoded referring to FIG. 13. As shown in FIG. 13, all the possible difference values are negative, the reason is because the estimated value is calculated in the assumption that all the available bits are used in the quantization. It cannot happen that the quantization consumes more bits than the available bits. The estimated value is the largest possible value. Therefore the actual value is never larger than the estimated value.

[4]

$$cb_{diff} = cb_{max} - cb'_{max} \quad \text{(Equation 4)}$$

Here, $cb'_{max}$ is the estimated value for the codebook which consumes the most bits, $cb_{max}$ is the actual value for the codebook which consumes the most bits and $cb_{diff}$ is the difference value between the actual value and the estimated value.

The detail process at decoder is illustrated as below:

1) Decode the position of the sub-vector whose codebook indication consumes the most bits, referring to the table in FIG. 12, 010 is corresponding to v3.
2) Decode the codebook indications for all other sub-vectors except v3.
3) Estimate the codebook whose indication consumes the most bits, it is done according to Equation 4.
4) Decode the difference between the actual value and the estimated value. The difference value is decoded referring to the table in FIG. 13, code 0 for difference is corresponding to difference 0.
5) Compute the decoded value by adding the estimated value and the difference. The detail calculation can be found in the following equation 5:

(Equation 5)

$$cb_{max} = cb_{diff} + cb'_{max} \quad [5]$$
$$= 0 + 11$$
$$= 11$$

Here, $cb'_{max}$ is the estimated value for the codebook which consumes the most bits, $cb_{max}$ is the actual value for the codebook which consumes the most bits and $cb_{diff}$ is the difference value between the actual value and the estimated value.

Advantageous Effects of Invention

By applying the invented method, it is possible to saving bits consumption.

The bits saving by the method proposed in this invention is calculated in the following equation 6:

[6]

$$Bits_{save} = Bits_{cb_{max}} - Bits_{position\_cb_{max}} - Bits_{cb_{diff}} \quad \text{(Equation 6)}$$

Here, $Bits_{save}$ is the bits saving by the proposed method in this invention, $Bits_{cbmax}$ is the bits consumption for the codebook which consumes the most bits, $Bits_{position\_cbmax}$ is the bits consumption for the position of the codebook which consumes the most bits and $Bits_{cbdiff}$ is the bits consumption to encode the difference value.

In the equation 6, the bits consumption for the codebook which consumes the most bits is propostional to its codebook number. Normally, when the bits available for spectrum is large, the largest codebook number is a large value. As shown in the above example, the largest codebook number is 11, and the bits consumption for the codebook indication is 11 bits.

The bits consumption of the position of the codebook which consumes the most bits consumes a fixed number of bits ($Bits_{position\_cb_{max}} = \log_2(N_{sv})$). As shown in the above example, the number of sub-vectors is 8. The bits consumption to indicate the position of the largest codebook consumes 3 bits.

The bits consumption of the difference value is smaller than the bits consumption of the codebook which consumes the most bits because the difference value is smaller than the codebook value. As shown in the above example, the bits consumption to encode the difference value is 1 bit.

The bits saving in the example is calculated in the following equation 7:

(Equation 7)

$$Bits_{save} = Bits_{cb_{max}} - Bits_{position\_cb_{max}} - Bits_{cb_{diff}} \quad [7]$$
$$= 11 - 3 - 1$$
$$= 7$$

BRIEF DESCRIPTION OF DRAWINGS

FIG. 10 shows the codebook information for the spectrum in FIG. 9;

FIG. 11 shows the codebook indication for all the sub-vectors;

FIG. 12 shows the code table for the position of the sub-vector whose codebook indication consumes most bits;

FIG. 13 shows the code table for the difference value;

FIG. 17 shows one example which encodes only part of the spectrum;

FIG. 18 shows the encoded parameters besides v2 for the example in FIG. 17;

DESCRIPTION OF EMBODIMENTS

Figure 14:
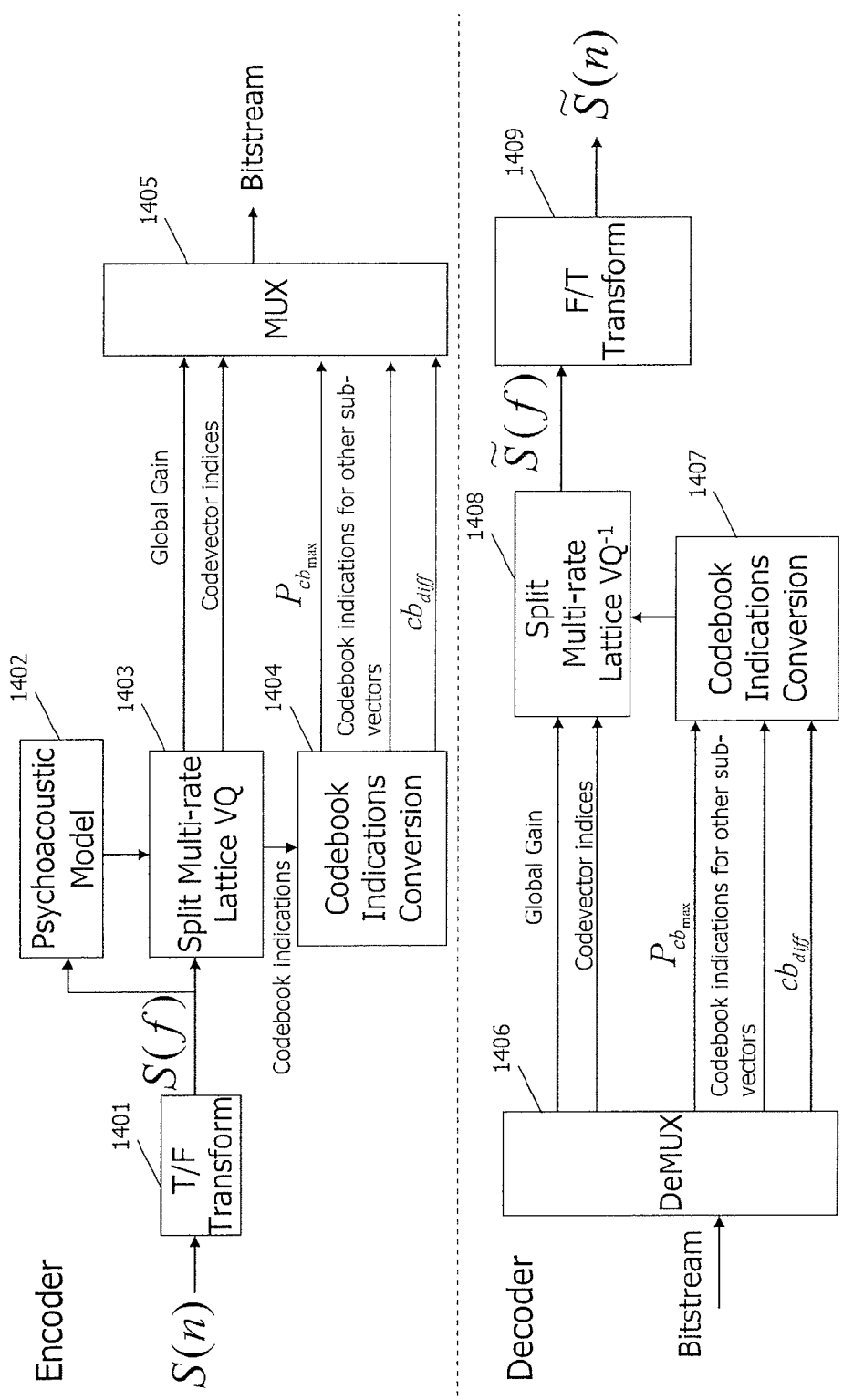
FIG. 14 illustrates the framework according to Embodiment 1 of the present invention.
Figure 15:
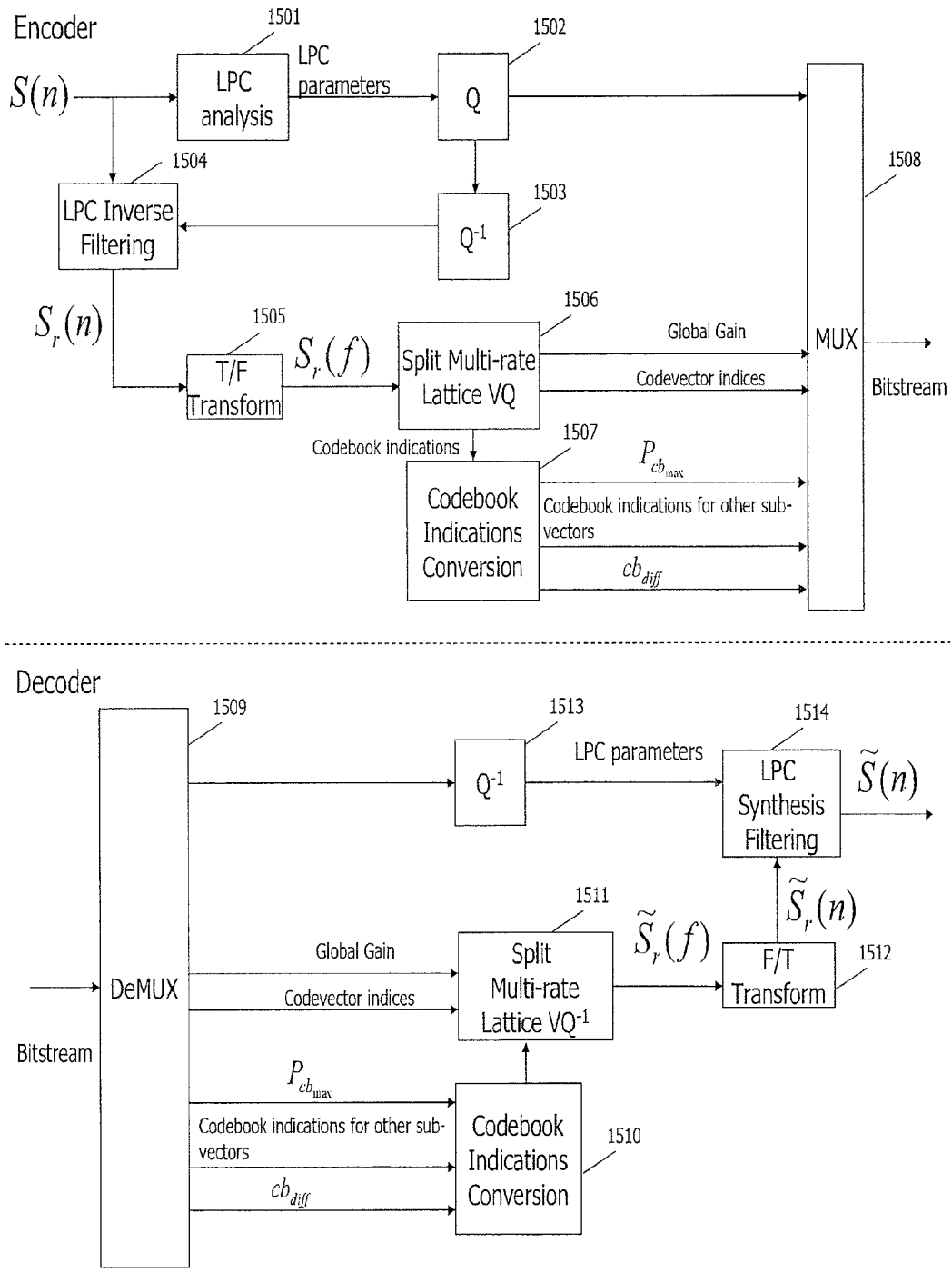
FIG. 15 illustrates the framework according to Embodiment 2 of the present invention.
Figure 16:
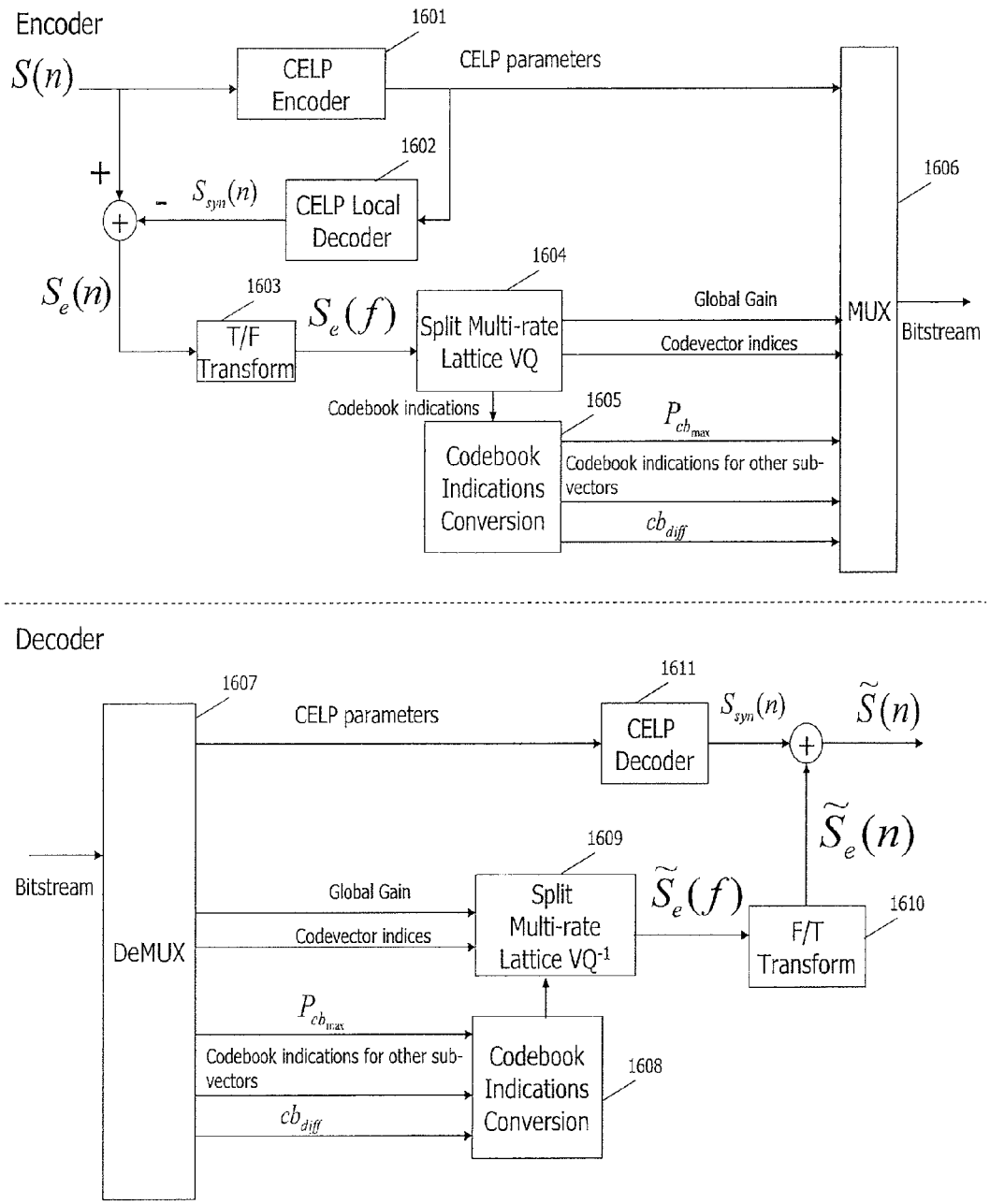
FIG. 16 illustrates the framework according to Embodiment 3 of the present invention.

The main principle of the invention is described in this section with the aid of FIG. 14 to FIG. 16. Those who are skilled in the art will be able to modify and adapt this invention without deviating from the spirit of the invention. Illustrations are provided to facilitate explanation.

Embodiment 1

FIG. 14 illustrates the invented codec, which comprises an encoder and a decoder that apply the split multi-rate lattice vector quantization.

In the encoder illustrated in FIG. 14, the time domain signal S(n) is transformed into frequency domain signal S(f) using time to frequency transformation method (1401), such as Discrete Fourier Transform (DFT) or Modified Discrete Cosine Transform (MDCT).

Psychoacoustic model analysis is done on the frequency domain signal S(f) to derive the masking curve (1402). Split multi-rate lattice vector quantization is applied on the frequency domain signal S(f) according to the masking curve derived from the psychoacoustic model analysis to ensure that the quantization noise is inaudible (1403).

The split multi-rate lattice vector quantization generates three sets of quantization parameters: the quantization index of the global gain, and codebook indications and code vector indices.

The codebook indications are converted according to the following manner (1404):
1) Compute the codebook indications for all sub-vectors
2) Identify and encode the position of the sub-vector whose codebook indication consumes the most bits and encode the codebook indications for all sub-vectors except the sub-vector consuming the most bits.
3) Estimate the codebook whose indication consumes the most bits
4) Encode the difference between the actual value and the estimated value The global gain index, the code vector indices, the position of the largest codebook, the difference value between the actual value and the estimated value and the codebook indications for other sub-vectors are multiplexed (1405) and transmitted to the decoder side.

In the decoder illustrated in FIG. 14, at the start, all the bit stream information is de-multiplexed by de-multiplexing section (1406).

The position of the largest codebook, the difference value between the actual value and the estimated value is converted to the largest codebook indication by the codebook indication conversion section (1407).

The detail process in the codebook indication conversion section is illustrated as below:
1) Decode the position of the sub-vector whose codebook indication consumes the most bits
2) Decode the codebook indications for all other sub-vectors
3) Estimate the codebook whose indication consumes the most bits
4) Decode the difference between the actual value and the estimated value
5) Compute the decoded value by adding the estimated value and the difference The global gain index, the code vector indices and the original codebook indications are dequantized by the split multi-rate lattice vector dequantization method to reconstruct the decoded frequency domain signal $\tilde{S}(f)$ (1408).

The decoded frequency domain signal $\tilde{S}(f)$ is transformed back to time domain, to reconstruct the decoded time domain signal $\tilde{S}(n)$ using frequency to time transformation method (1409), such as Inverse Discrete Fourier Transform (IDFT) or Inverse Modified Discrete Cosine Transform (IMDCT).

In this embodiment, by estimating the value of the largest codebook in the spectrum and converting the largest codebook indication to the position of the largest codebook and the difference value between the actual value and estimated value, the bits consumption can be reduced.

Embodiment 2

The feature of this embodiment is the invented methods are applied in TCX codec.

In the encoder illustrated in FIG. 15, LPC analysis is done on the input signal to exploit the predictable nature of signals in time domain (1501). The LPC coefficients from the LPC analysis are quantized (1502), the quantization indices are multiplexed (1508) and transmitted to decoder side. With the quantized LPC coefficients quantized by dequantization section (1503), the residual (excitation) signal $S_r(n)$ is obtained by applying LPC inverse filtering on the input signal S(n) (1504).

The residual signal $S_r(n)$ is transformed into frequency domain signal $S_r(f)$ using time to frequency transformation method (1505), such as Discrete Fourier Transform (DPT) or Modified Discrete Cosine Transform (MDCT).

Split multi-rate lattice vector quantization is applied on the frequency domain signal $S_r(f)$ (1506).

The split multi-rate lattice vector quantization generates three sets of quantization parameters: the quantization index of the global gain, and codebook indications and code vector indices.

The codebook indications are converted according to the following manner (1507):
1) Compute the codebook indications for all sub-vectors
2) Identify and encode the position of the sub-vector whose codebook indication consumes the most bits and encode the codebook indications for all sub-vectors except the sub-vector consuming the most bits.

3) Estimate the codebook whose indication consumes the most bits
4) Encode the difference between the actual value and the estimated value The global gain index, the code vector indices, the position of the largest codebook, the difference value between the actual value and the estimated value and the codebook indications for other sub-vectors are multiplexed (1508) and transmitted to the decoder side.

In the decoder illustrated in FIG. 15, at the start, all the bitstream information is de-multiplexed by demultiplexing section (1509).

The position of the largest codebook, the difference value between the actual value and the estimated value is converted to the largest codebook indication by the codebook indication conversion section (1510).

The detail process in the codebook indication conversion section (1510) is illustrated as below:
1) Decode the position of the sub-vector whose codebook indication consumes the most bits
2) Decode the codebook indications for all other sub-vectors
3) Estimate the codebook whose indication consumes the most bits
4) Decode the difference between the actual value and the estimated value
5) Compute the decoded value by adding the estimated value and the difference The global gain index, the code vector indices and the original codebook indications are dequantized by the split multi-rate lattice vector dequantization method to reconstruct the decoded frequency domain signal $\tilde{S}_r(f)$ (1511).

The decoded frequency domain residual signal $\tilde{S}_r(f)$ is transformed back to time domain, to reconstruct the decoded time domain residual signal $\tilde{S}_r(n)$ using frequency to time transformation method (1512), such as Inverse Discrete Fourier Transform (IDFT) or Inverse Modified Discrete Cosine Transform (IMDCT).

With the dequantized LPC parameters dequantized by the dequantization section (1513), the decoded time domain residual signal $\tilde{S}_r(n)$ is processed by LPC synthesis filter (1514) to obtain the decoded time domain signal $\tilde{S}(n)$.

Embodiment 3

The feature of this embodiment is the spectral cluster analysis method is applied in hierarchical coding (layered coding, embedded coding) of CELP and transform coding.

In the encoder illustrated in FIG. 16, CELP encoding is done on the input signal to exploit the predictable nature of signals in time domain (1601). With the CELP parameters, the synthesized signal is reconstructed by the CELP decoder (1602), and the CELP parameters are multiplexed (1606) and transmitted to decoder side. The prediction error signal $S_e(n)$ (the difference signal between the input signal and the synthesized signal) is obtained by subtracting the synthesized signal from the input signal.

The prediction error signal $S_e(n)$ is transformed into frequency domain signal $S_e(f)$ using time to frequency transformation method (1603), such as Discrete Fourier Transform (DFT) or Modified Discrete Cosine Transform (MDCT).

Split multi-rate lattice vector quantization is applied on the frequency domain signal $S_e(f)$ (1604).

The split multi-rate lattice vector quantization generates three sets of quantization parameters: the quantization index of the global gain, and codebook indications and code vector indices.

The codebook indications are converted according to the following manner (1605):
1) Compute the codebook indications for all sub-vectors
2) Identify and encode the position of the sub-vector whose codebook indication consumes the most bits and encode the codebook indications for all sub-vectors except the sub-vector consuming the most bits.
3) Estimate the codebook whose indication consumes the most bits
4) Encode the difference between the actual value and the estimated value The global gain index, the code vector indices, the position of the largest codebook, the difference value between the actual value and the estimated value and the codebook indications for other sub-vectors are multiplexed (1508) and transmitted to the decoder side.

In the decoder illustrated in FIG. 16, at the start, all the bitstream information is de-multiplexed by the de-multiplexing section (1607).

The position of the largest codebook, the difference value between the actual value and the estimated value is converted to the largest codebook indication by the codebook indication conversion section (1608).

The detail process in the codebook indication conversion section (1608) is illustrated as below:
1) Decode the position of the sub-vector whose codebook indication consumes the most bits
2) Decode the codebook indications for all other sub-vectors
3) Estimate the codebook whose indication consumes the most bits
4) Decode the difference between the actual value and the estimated value
5) Compute the decoded value by adding the estimated value and the difference The global gain index, the code vector indices and the original codebook indications are dequantized by the split multi-rate lattice vector dequantization method to reconstruct the decoded frequency domain signal $\tilde{S}_e(f)$ (1609).

The decoded frequency domain residual signal $\tilde{S}_e(f)$ is transformed back to time domain, to reconstruct the decoded time domain residual signal $\tilde{S}_e(n)$ using frequency to time transformation method (1610), such as Inverse Discrete Fourier Transform (IDFT) or Inverse Modified Discrete Cosine Transform (IMDCT).

With the CELP parameters, the CELP decoder reconstructs the synthesized signal $S_{syn}(n)$ (1611), the decoded time domain signal $\tilde{S}(n)$ is reconstructed by adding the CELP synthesized signal $S_{syn}(n)$ and the decoded prediction error signal $\tilde{S}_e(n)$.

Embodiment 4

In this embodiment, an idea to prevent the possibilities that the new method consumes more bits than original method of split multi-rate lattice VQ is illustrated.

In the proposed frameworks in embodiment 1, embodiment 2 and embodiment 3, there is possibility that the bits consumption of the new method is larger than the conventional method, when the largest codebook doesn't consume so many bits. As shown in the equation 6, if $Bits_{cb_{max}} < Bits_{position\_cb_{max}} + Bits_{cb_{diff}}$, then the bits consumption of the new method is larger than the conventional method.

In order to prevent this problem, an idea is proposed in this embodiment. The idea is to reduce the bits consumption to indicate the position of the codebook which consumes the most bits. In the encoder side, the codebook of a fixed sub-vector, as example, the last sub-vector's codebook is estimated according to the total bits available and the bits usage of all other sub-vectors. Instead of the actual codebook, the difference value between the actual codebook value and the estimated value is encoded and transmitted to the decoder side. In Split multi-rate VQ, the calculation of global gain ensures that most of the allocated bits are utilized in encoding of the sub-vectors, the estimated codebook value which calculated with assumption that all the bits are utilized is very close to the actual value, the absolute value of the difference is smaller than the actual codebook value, the bits consumption to encode the difference value is smaller than the actual value.

The detail encoding process is illustrated as below:
1) Compute the codebook indications for all sub-vectors
2) Identify the position of the sub-vector whose codebook indication consumes the most bits
3) Compare the codebook value with a predefined threshold (the threshold can be a predefined value which was calculated based on a large database to ensure that the bits consumption of the invented method is smaller than the conventional method):
   A. if the codebook value is larger than the threshold, the following is done:
      a) Estimate the codebook index for the codebook value whose indication consumes the most bits
      b) Encode the difference between the actual value and the estimated value
      c) Encode the position of the sub-vector whose codebook indication consumes the most bits and encode the codebook indications for all sub-vectors except the sub-vector consuming the most bits
   B. if the codebook value is not larger than the threshold, the following is done:
      a) Estimate the codebook value for the last sub-vector
      b) Encode the difference between the actual value and the estimated value and encode the codebook indications for all sub-vectors except the last sub-vector.

The detail encoding process is illustrated as below:
1) Decode the codebook indications for all other sub-vectors
2) Estimate the codebook value for the sub-vector whose codebook indication was converted,
3) Decode the difference between the actual value and the estimated value
4) Compute the decoded value by adding the estimated value and the difference
5) Compare the decoded value with a predefined threshold;
   A. if the decoded value is larger than the threshold, the following is done:
      a) Decode the position of the sub-vector whose codebook indication consumes the most bits
   B. if the decoded value is not larger than the threshold, the following is done: $cb_{last} = cb_{max}$, In this embodiment, by comparing the codebook value which consumes the most bits with some predefined threshold, the scenarios when the bits consumption achieved by the invented methods is more bits than the original split multi-rate VQ are avoided. It ensures that there are always bits saving.

It is not limited to be the last sub-vector, it can be decided according to the characteristics of the input spectrum. As example, if the codebook of the first sub-vector is statistically larger than other sub-vectors, then the first sub-vector can be selected.

In this embodiment, for the scenarios when bits consumption of the largest codebook is not so many, the last code vector is encoded as the largest codebook, as its position are fixed, the bits consumption to indicate the position of the largest codebook is avoided. Then the bits saving by the invented method can be ensured to be a positive value.

Embodiment 5

In prior art, the codebook indications are not designed according to the probability of the codebook usage. But rather simply, the codebook indication table as shown in FIG. 6 is widely used.

In different scenarios, such as different bitrate, different number of sub-vectors, the statistics on the use of the codebooks vary.

In NPL 7, some statistics on the use of RE8 codebooks are summarized in FIG. 17 (statistics on codebook numbers (in %)).

Figure 1:
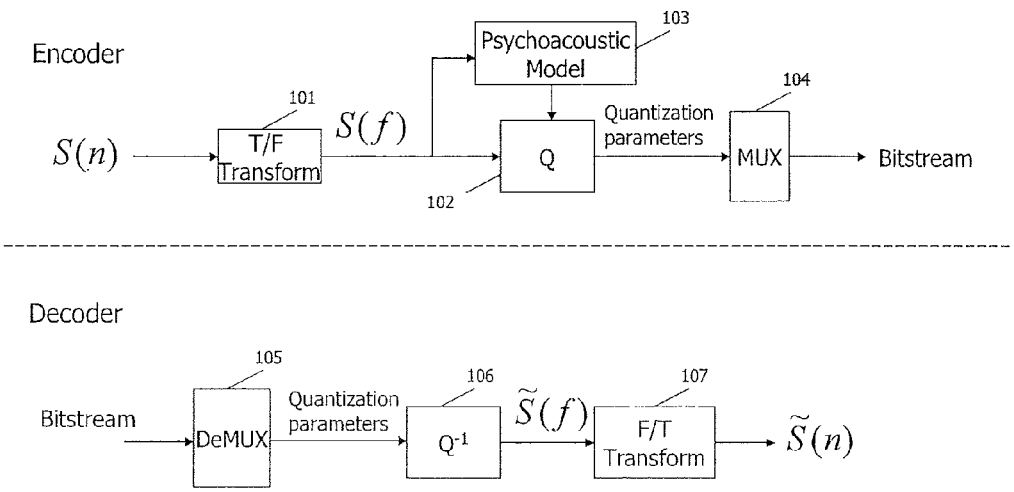
FIG. 1 illustrates a simple framework of transform codec.
Figure 2:
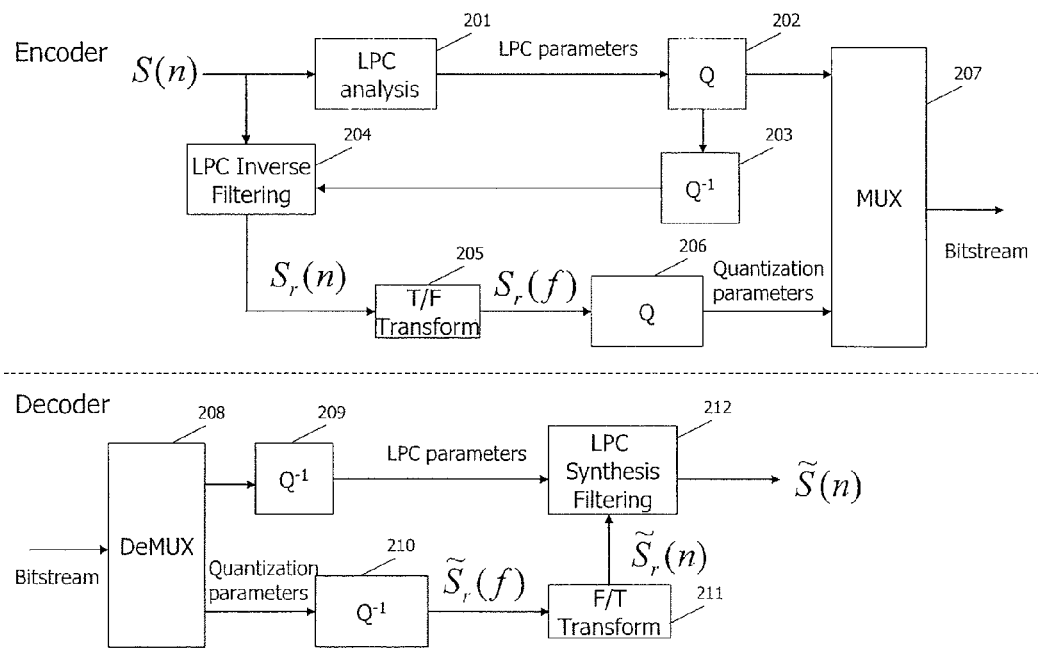
FIG. 2 illustrates a simple framework of TCX codec.
Figure 3:
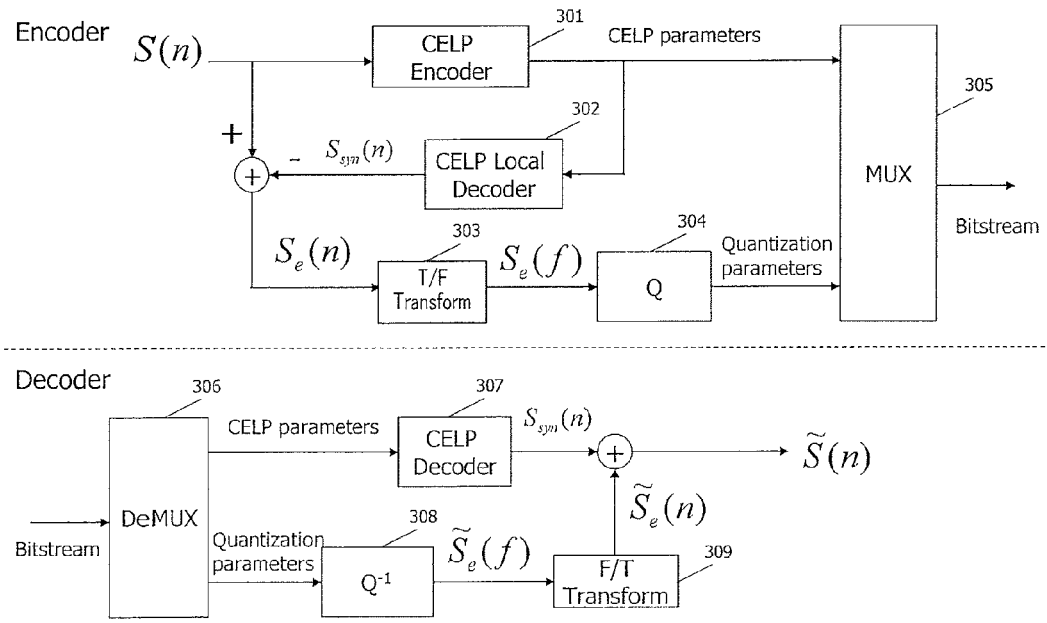
FIG. 3 illustrates a simple framework of layered codec (CELP+transform)
Figure 4:
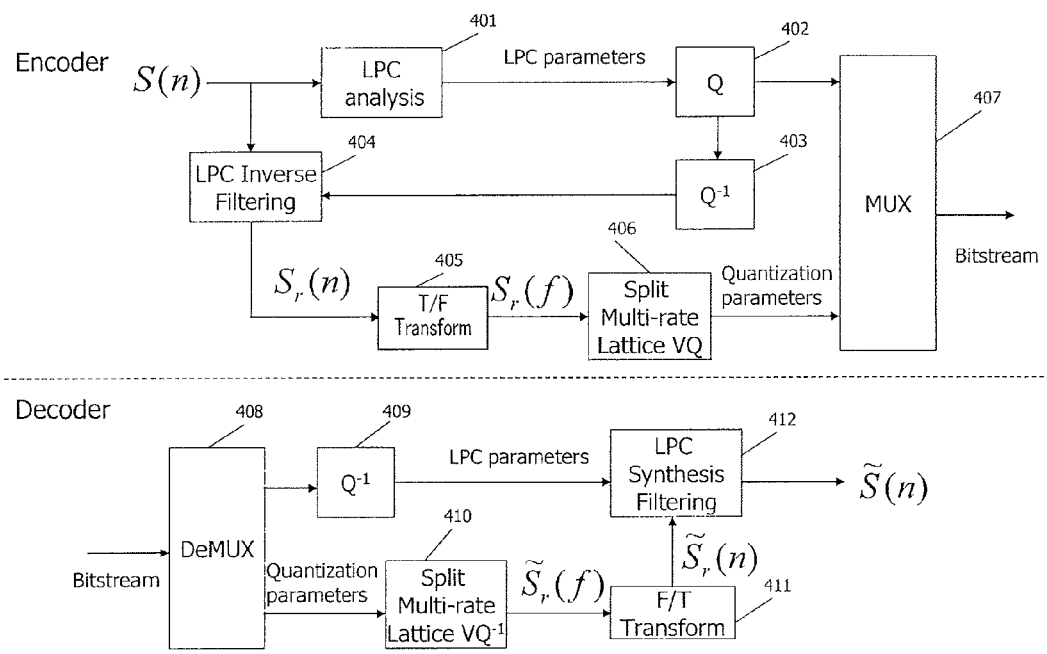
FIG. 4 illustrates a framework of TCX codec which utilizes split multi-rate lattice vector quantization.
Figures 5, 6:
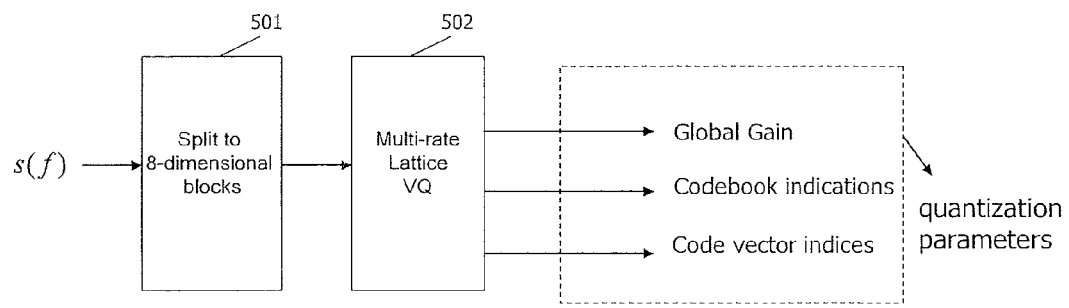
FIG. 5 illustrates the process of split multi-rate lattice vector quantization.
FIG. 6 shows the table of the codebooks for split multi-rate lattice VQ.
Figure 7:
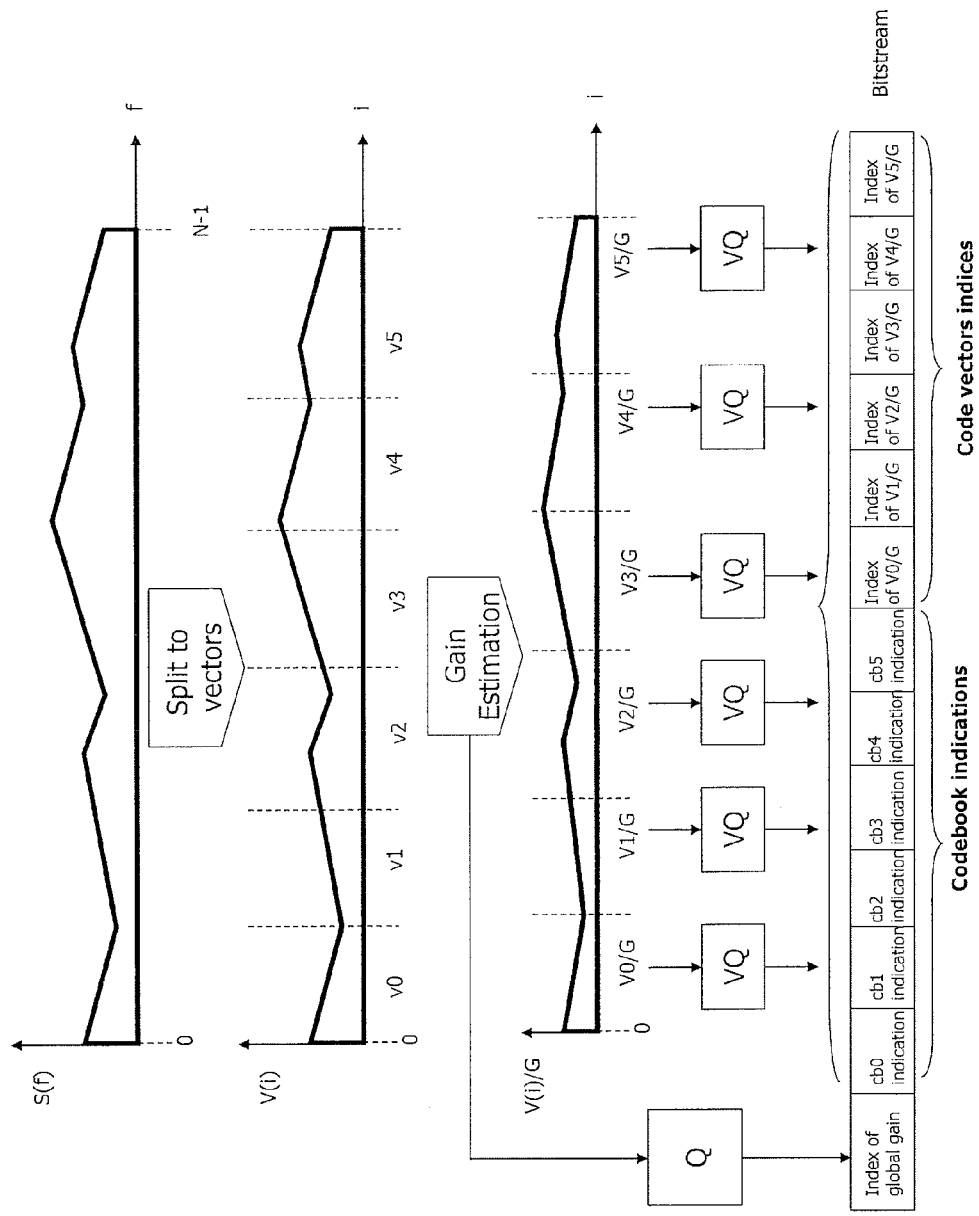
FIG. 7 illustrates one way of bit stream formation.
Figure 8:
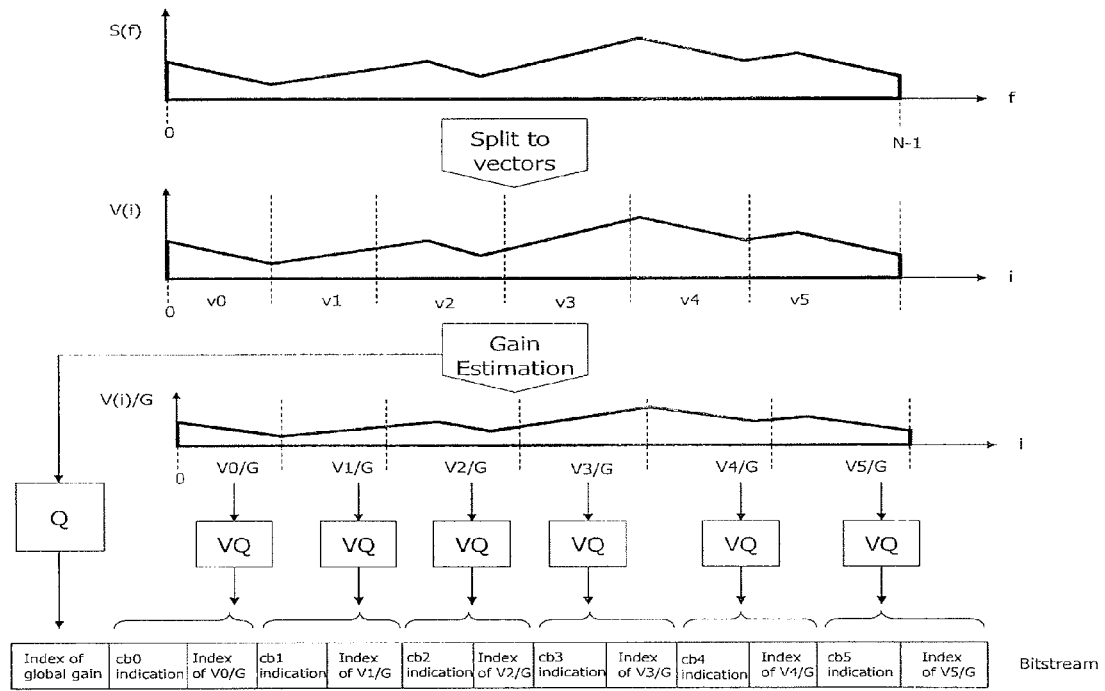
FIG. 8 illustrates another way of bit stream formation.
Figure 9:
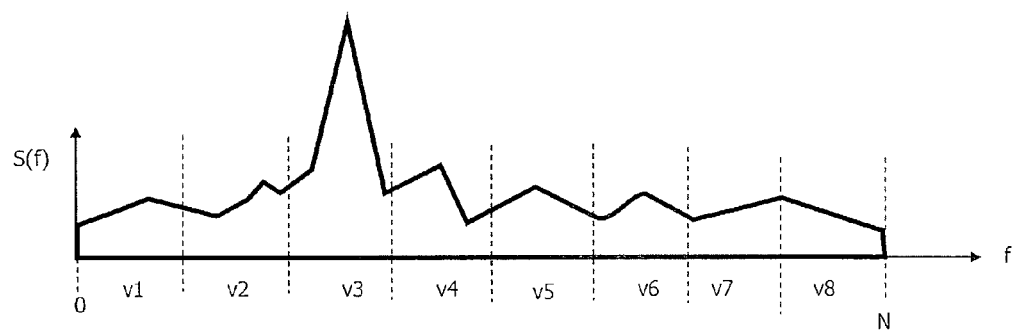
FIG. 9 shows an example input spectrum.

From the statistical information, it can be observed that the design of the codebook indication table in FIG. 6 is not efficient for the application in NPL 7. As Q0 indication consumes the least bits (1 bit), but its probability is very low, only 3%. Q2's usage is highest (29%), but its bits consumption is not the least.

Therefore, it is desirable to design the codebook indications using a Huffman table design method, for each fixed condition (same bit rate, same number of sub vectors to be quantized), according to the probability of each codebook, allocate bits to the codebook indications, the guideline is to allocate fewer bits to the codebook which have large probability, to allocate more bits to the codebook which have small probability.

Then the invented method in this invention is applied to the codebook indication which consumes the most bits instead of the codebook indication which has the largest codebook number.

The detail process at encoder is illustrated as below:
1) Encode the codebook indications for all sub-vectors
2) Identify and encode the position of the sub-vector whose codebook indication consumes the most bits
3) Estimate the codebook whose indication consumes the most bits
4) Encode the difference between the actual value and the estimated value The detail process at decoder is illustrated as below:
1) Decode the position of the sub-vector whose codebook indication consumes the most bits
2) Decode the codebook indications for all other sub-vectors
3) Estimate the codebook whose indication consumes the most bits
4) Decode the difference between the actual value and the estimated value
5) Compute the decoded value by adding the estimated value and the difference Embodiment 6

The feature of this embodiment is the bits saved by codebook indication conversion method are utilized to improve the gain accuracy for the quantized vectors.

In this embodiment, the bits saved by the codebook indication conversion method arc utilized to give a finer resolution to the global gain by dividing the spectrum into smaller hands and assigning a 'gain correction factor' to each band. By utilizing the bits saved to transmit the gain correction factors, the quantization performance can be improved, sound quality can be improved.

The codebook indication conversion method can be applied to encoding of stereo or multi-channel signals. For example, the invented method is applied for encoding of side-signals and the saved bits are used in principal-signal coding. This would bring subjective quality improvement because principal-signal is perceptually more important than side-signal.

Furthermore, the codebook indication conversion method can be applied to the codec which encodes spectral coefficients in the plural frames basis (or plural sub frames basis). In this application, the saved bits by codebook indication conversion method can be accumulated and utilized to encode spectral coefficients or some other parameters in the next coding stage.

Furthermore, the bits saved by codebook indication conversion method can be utilized in FEC (Frame Erasure Concealment), so that the sound quality can be retained in frame lost scenarios.

Although all of the embodiments above are explained using split multi-rate lattice vector quantization, this invention is not limited to use of split multi-rate lattice vector quantization and it can be applied to other spectral coefficients coding method. Those who are skilled in the art will be able to modify and adapt this invention without deviating from the spirit of the invention.

Embodiment 7

In this embodiment, an idea to prevent the possibilities that the difference $cb_{diff}$ between the actual codebook indication $cb_{max}$ and the estimated codebook indication $cb'_{max}$ is positive.

In the proposed frameworks in embodiment 1, embodiment 2 and embodiment 3, there is an assumption that all the sub vectors are quantized by AVQ. If all the sub vectors are quantized by AVQ, all the possible values of $cb_{diff}$ are negative, the reason is because the estimated codebook indication is calculated in the assumption that all the available bits are used in the quantization. It cannot happen that the quantization consumes more bits than the available bits. The estimated codebook indication is the largest possible value. Therefore the actual codebook indication is never larger than the estimated codebook indication.

However, if not all the sub vectors are quantized by AVQ, it is possible that $cb_{diff}$ is positive, especially when energy are concentrated in the low frequency part of the spectrum, the bits are all distributed to the sub vectors at low frequency, there are no bits allocated to the sub vectors which are at high frequency. As example, the total bits allocated to quantize an 8 sub vector spectrum are 72, and the codebook indications for all the sub vectors are listed in FIG. 17. It can be seen that for the last two sub vectors, there are not bits left to encode their codebook indications. In this case, in order to apply the invented method, the codebook indications for the last two sub vectors are necessary to be transmitted, two bits are utilized for the indications.

The bits consumption for all the sub vectors except v2, the sub vector whose codebook indication consumes the most bits is shown in FIG. 18. v2's codebook is estimated in the following equation 8:

[8]
$$cb'_{max}(72-10-15-1-1-10-1-1)/5=33/5 \approx 6 \quad \text{(Equation 8)}$$

The difference between the actual codebook indication and the estimated codebook indication is calculated in the following equation 9:

[9]
$$cb_{diff}=cb_{max}-cb'_{max}=1 \quad \text{(Equation 9)}$$

In order to solve this problem, ideas are proposed in this embodiment.

The straightforward method is to include the positive values in the codebook for $cb_{diff}$. However, this method would cause the bits consumption for encoding the $cb_{diff}$ increase.

Another idea is to deactivate the proposed idea in this invention when not all the sub vectors are quantized by AVQ. The problem is it needs flag to indicate whether the proposed idea is activated or not. An idea which can derive the information from the available information is introduced in order to avoid transmitting the flag.

The idea is to encode the AVQ parameters as in the conventional way at encoder side, and in decoder side, using the bits usage information to derive whether the proposed method in this invention is activated or not.

Figure 19:
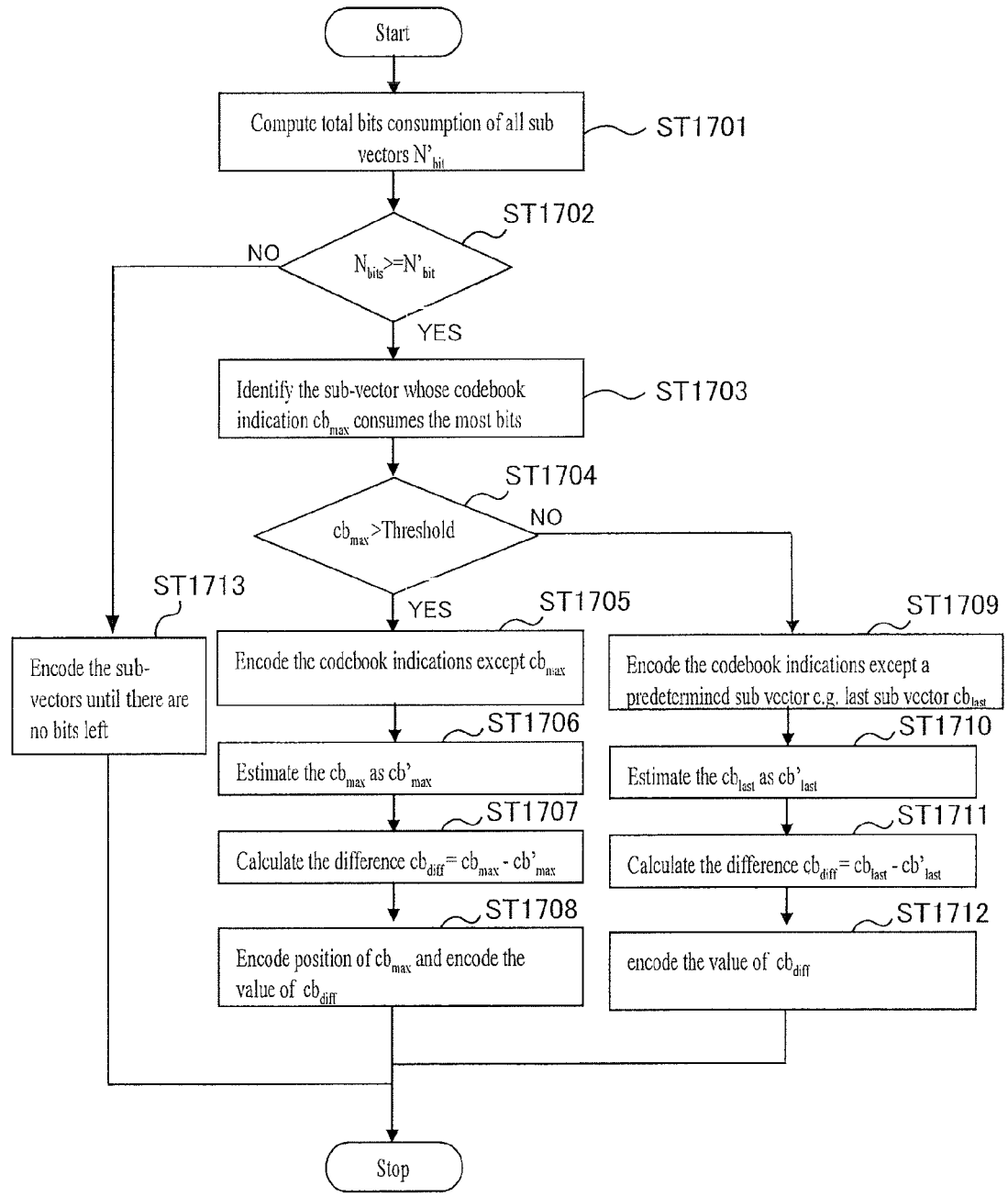
FIG. 19 shows the flowchart of the proposed encoding process in embodiment 7

The detail encoding process is illustrated as below (the flow chart can be seen in FIG. 19). Compute the total bits consumption $N'_{bits}$ for all sub-vectors in step (hereinafter abbreviated as "ST") 1701

Check whether the bits available $N_{bits}$ are enough to encode the AVQ parameters for all the sub vectors ($N_{bits}>=N'_{bits}$) in ST 1702. Proceed to ST1703 if the bits available are enough to encode the AVQ parameters for all the sub-vectors, and proceed to ST 1713 if the bits available are not enough.

Identify the position of the sub-vector whose codebook indication consumes the most bits in ST1703

Compare the codebook indication with a predefined threshold in ST 1704. Proceed to ST 1705 if the codebook indication is larger than the threshold, and proceed to ST 1709 if the codebook indication is not larger than the threshold.

Encode the codebook indications for all sub-vectors except the sub-vector consuming the most bits in ST 1705

Estimate the codebook indication for the sub-vector whose codebook indication consumes the most bits in ST 1706

Calculate a difference ($cb_{diff}$) between the actual codebook indication ($cb_{max}$) and the estimated codebook indication ($cb'_{max}$) in ST 1707

Encode the position of the sub-vector whose codebook indication consumes the most bits, and encode the difference $cb_{diff}$ in ST 1708

If the codebook indication is not larger than the threshold in ST 1704, encode the codebook indications for all sub-vectors except the predetermined sub vector e.g. last sub vector in ST 1709.

Estimate the codebook indication $cb_{last}$ for a predetermined sub vector e.g. last sub vector in ST 1710

Calculate a difference ($cb_{diff}$) between the actual codebook indication ($cb_{last}$) and the estimated codebook indication $cb'_{last}$ in ST1711

Encode the difference $cb_{diff}$ in ST1712

If the bits available are not enough to encode the AVQ parameters for all the sub-vectors in ST 1702, encode the codebook indications for sub-vectors until there are no bits left in ST 1713.

Figure 20:
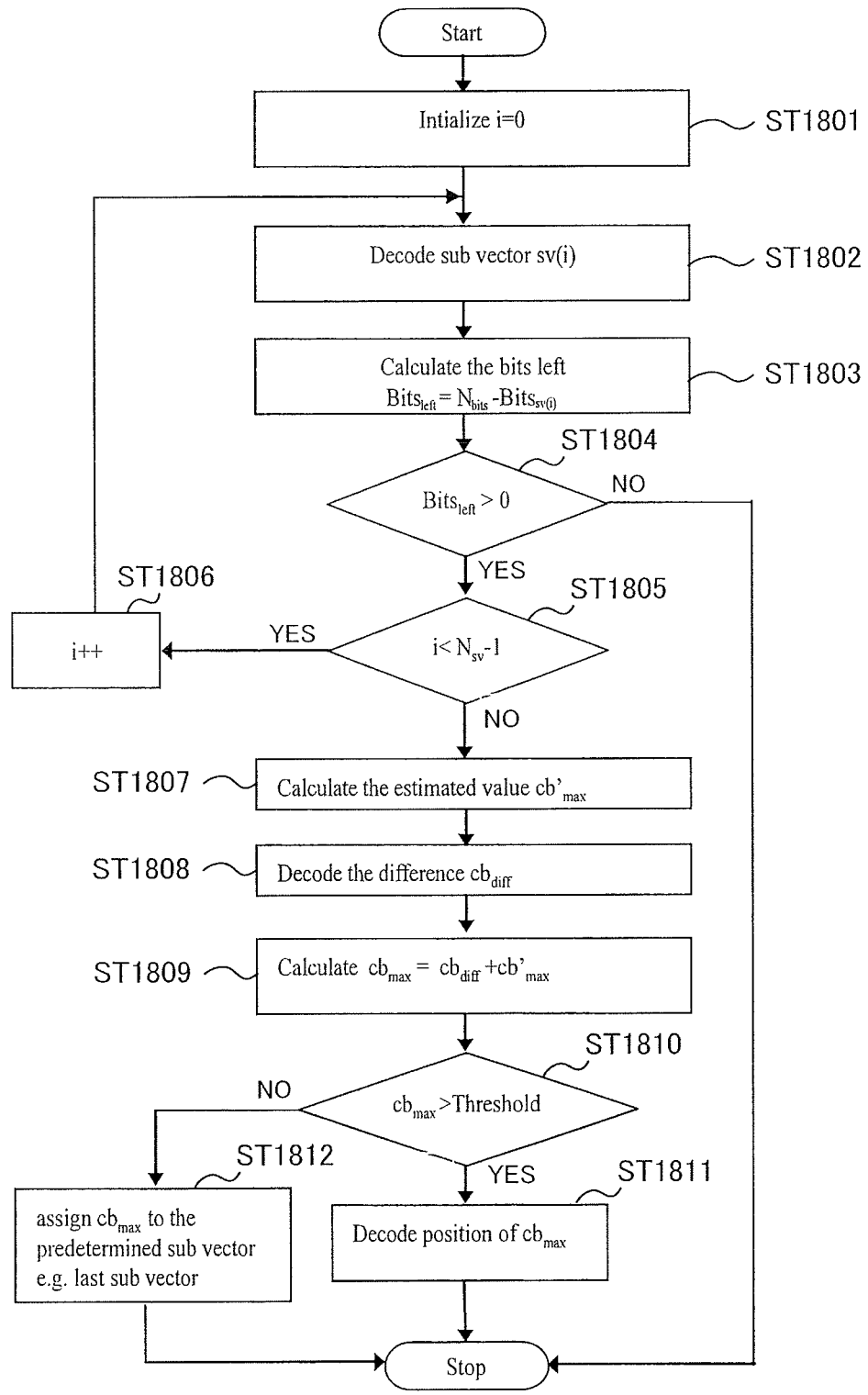
FIG. 20 shows the flowchart of the proposed decoding process in embodiment 7.

The detail decoding process is illustrated as below (the flow chart can be seen in FIG. 20). Initialize i=0 in ST 1801, decode the codebook indications for sub-vectors in ST 1802 and calculate the number of bits left in ST 1803

If the bits left is 0 before all sub-vectors are decoded, then the subsequent process will not be executed and the decoding process will be terminated in ST 1804. If the bits left is larger than 0 after all other sub-vector are decoded, proceed to ST 1805 in ST 1804.

Check whether i is less than a value resulting from subtracting one from the number of sub-vectors $N_{sv}$ ($i<N_{sv}-1$) in ST 1805: If i is less than the value, increment i in ST 1806 and then proceed to ST 1802. If i is not less than the value ($i>=N_{sv}-1$), proceed to ST 1807

Estimate the codebook indication for the sub-vector whose codebook indication was converted in ST 1807. That is, calculate the estimated codebook indication $cb'_{max}$ Decode the difference $cb_{diff}$ between the actual codebook indication and the estimated codebook indication in ST 1808

Compute the decoded codebook indication by adding the estimated codebook indication and the difference in ST 1809

Compare the decoded codebook indication with a predefined threshold in ST 1810; Proceed to ST 1811 if the decoded codebook indication is larger than the threshold, and proceed to ST 1812 if the decoded codebook indication is not larger than the threshold Decode the position of the sub-vector whose codebook indication consumes the most bits in ST 1811

If the decoded codebook indication is not larger than the threshold in ST 1810, assign $cb_{max}$ to the predetermined sub vector e.g. last sub vector $cb_{last}=cb_{max}$ in ST 1812

In this embodiment, by utilizing the bits left information after each sub vector is decoded in decoder side, the problem which caused positive value of the $cb_{diff}$ is solved without any flag information.

Embodiment 8

In this embodiment, an idea to prevent the possibilities that the new method consumes more bits than original method of split multi-rate lattice VQ is illustrated.

In the proposed frameworks in embodiment 1, embodiment 2 and embodiment 3, there is possibility that the bits consumption of the new method is larger than the conventional method, when there are a quite large number of unused bits. In NPL, it was also mentioned that sometimes the bits usage is less than the allocated bits. As shown in the equation 6, if $Bits_{cb_{max}}<Bits_{position\_cb_{max}}+Bits_{cb_{diff}}$, then the bits consumption of the new method is larger than the conventional method, when there are a large number of unused bits, the value of $cb_{diff}$ is large, then its bits consumption is also large, then it may happen that the bits consumption for the new method is larger than the conventional method. In order to prevent this problem, an idea is proposed in this embodiment.

The idea is to fully utilize the allocated bits in the vector quantization. One possible way is to utilize the unused bits to increase the codebook number for the sub vectors which have largest energies; another possible way is to utilize the unused bits to encode the sub vectors which are encoded as null vectors.

Figure 21:
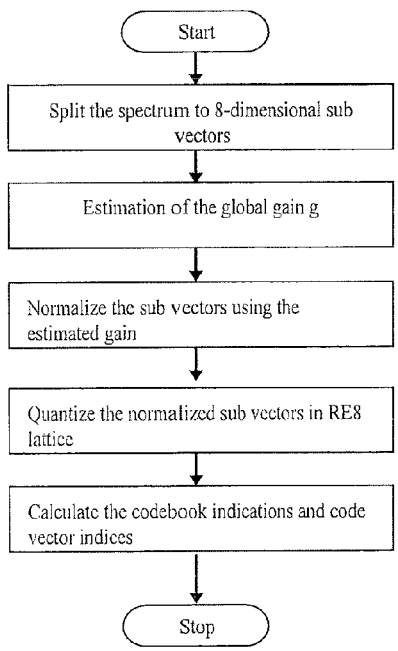
FIG. 21 shows the flowchart of conventional split multi-rate VQ.

In the encoder side, after the bits consumption estimation with the estimated global gain, the number of unused bits is calculated, and the unused bits are distributed to the sub vectors which have the largest energies or the sub vectors which are encoded as null vectors. The flow chart of the original split multi-rate lattice VQ is shown in FIG. 21 and the flow chart of the proposed method is shown in FIG. 22.

Figure 22:
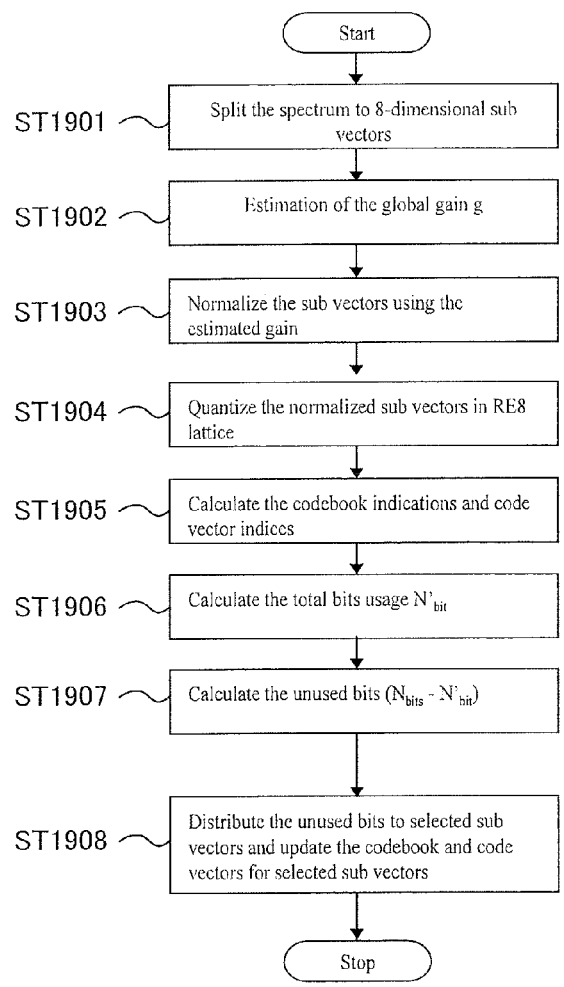
FIG. 22 shows the flowchart of proposed split multi-rate VQ in embodiment 8.

In FIG. 22, split the spectrum to 8-dimensional sub-vectors in ST 1901, and estimate the global gain g in ST 1902

Normalize the sub-vectors using the estimated global gain g in ST 1903, a nd quantize the normalized sub-vectors in RE 8 lattice in ST 1904

Calculate the codebook indications and code vector indeces in ST 1905, and calculate the total bits consumption $N'_{bits}$ in ST 1906

Calculate the unused bits in ST 1907, and distribute the unused bits to the sub-vectors having the largest energy (the selected sub-vectors) and update the codebook and code vectors for this selected sub-vectors In this embodiment, by distributing the unused bits to the selected sub vectors, there are two technical merits, one is that most of the allocated bits are utilized to encode the sub vectors in the current frame and the other one is that the difference value $cb_{diff}$ is very small, so that less bits are used for encoding of the difference value. It will result more bits saving.

The disclosure of the specification, the drawings, and the abstract included in Japanese Patent Application No. 2012-027702 filed on Feb. 10, 2012 is incorporated herein by reference in their entirety.

INDUSTRIAL APPLICABILITY

The audio/speech encoding apparatus, audio/speech decoding apparatus, audio/speech encoding and audio/speech decoding methods according to the present invention are applicable to a wireless communication terminal apparatus, base station apparatus in a mobile communication system, tele-conference terminal apparatus, video conference terminal apparatus and voice over internet protocol (VoIP) terminal apparatus.

REFERENCE SIGNS LIST

1401, 1505, 1603 T/F transformation section
1402 psychoacoustic model analysis section
1403, 1506, 1604 split multi-rate lattice VQ section
1404, 1407, 1507, 1510, 1605, 1608 codebook indication conversion section
1405, 1508, 1606 multiplexing section
1406, 1509, 1607 de-multiplexing section
1408, 1511, 1609 split multi-rate lattice $VQ^{-1}$ section
1409, 1512, 1610 F/T transformation section
1501 LPC analysis section
1502 quantization section
1503, 1513 dequantization section
1504 LPC inverse filter
1514 LPC synthesis filter
1601 CELP encoder
1602 CELP local decoder
1611 CELP decoder

The invention claimed is:

1. An audio/speech encoding apparatus that receives audio/speech signals that include a time domain input signal, comprising:
   a time to frequency domain transformation section configured to transform the time domain input signal to a frequency spectrum;
   a vector quantization section configured to perform quantization splitting the input signal of the frequency spectrum into sub-vectors and generating codebook indications for the sub-vectors, wherein the greater codebook indication, the greater codebook indication bit consumption; and
   a codebook indication transformation section configured to transform the codebook indications, wherein when total bits available is equal to or greater than total bits consumption for the quantization, a position of a sub-vector whose codebook indication consumes the most bits is identified, when the codebook indication consuming the most bits is greater than a threshold, the identified position, the codebook indications for all the sub-vectors except the codebook indication consuming the most bits, and a difference between bit consumption of the codebook indication consuming the most bits and its estimate are encoded, when the codebook indication consuming the most bits is not greater than the threshold, the codebook indications for all the sub-vectors except the sub-vector with a pre-identified position and a difference between bit consumption of the codebook indication of the sub-vector with the pre-identified position and its estimate are encoded, and when the total bits available is less than the total bits consumption for the quantization, the codebook indications are encoded until there are no available bits left; and a transmitter configured to transmit encoded audio/speech signals over a communication channel to an audio/speech decoding apparatus.

2. The audio/speech encoding apparatus according to claim 1, wherein the estimate of the bit consumption of the codebook indication consuming the most bits is based on the total bits available and bits usage for other sub-vectors.

3. The audio/speech encoding apparatus according to claim 1, wherein the estimate of the bit consuming of the codebook indication of the sub-vector with the pre-identified position is based on the total bits available and bits usage for other sub-vectors.

4. An audio/speech encoding method, which uses an audio/speech encoding apparatus, comprising:

receiving audio/speech signals, including a time domain input signal;

transforming the time domain input signal to a frequency spectrum;

performing quantization splitting the input signal of the frequency spectrum into sub-vectors and generating codebook indications for the sub-vectors, wherein, the greater codebook indication, the greater codebook indication bit consumption;

transforming the codebook indications, wherein when total bits available is equal to or greater than total bits consumption for the quantization, a position of a sub-vector whose codebook indication consumes the most bits is identified;

when the codebook indication consuming the most bits is greater than a threshold, the identified position, the codebook indications for all the sub-vectors except the codebook indication consuming the most bits and a difference between bit consumption of the codebook indication consuming the most bits and its estimate are encoded; and when the codebook indication consuming the most bits is not greater than the threshold, the codebook indications for all the sub-vectors except the sub-vector with a pre-identified position and a difference between bit consumption of the codebook indication of the sub-vector with the pre-identified position and its estimate are encoded;

when the total bits available are less than the total bits consumption for the quantization, the codebook indications are encoded until there are no available bits left; and transmitting encoded audio/speech signals over a communication channel to an audio/speech decoding apparatus.

* * * * *